United States Patent [19]
Shimomura et al.

[11] Patent Number: 5,643,406
[45] Date of Patent: Jul. 1, 1997

[54] CHEMICAL-MECHANICAL POLISHING (CMP) METHOD FOR CONTROLLING POLISHING RATE USING IONIZED WATER, AND CMP APPARATUS

[75] Inventors: Mariko Shimomura; Naoto Miyashita, both of Yokohama; Hiroyuki Ohashi, Kamakura, all of Japan

[73] Assignee: Kabushiki Kaisha Toshiba, Kawasaki, Japan

[21] Appl. No.: 661,897

[22] Filed: Jun. 12, 1996

[30] Foreign Application Priority Data

Jun. 13, 1995 [JP] Japan .................. 7-170303

[51] Int. Cl.$^6$ .................. H01L 21/304; B24B 1/00
[52] U.S. Cl. .................. 156/636.1; 156/645.1; 156/345; 216/88; 216/89; 51/308; 451/41
[58] Field of Search .................. 156/636.1, 645.1, 156/345; 216/38, 88, 89

[56] References Cited

U.S. PATENT DOCUMENTS

| | | |
|---|---|---|
| 5,320,706 | 6/1994 | Blackwell . |
| 5,516,346 | 5/1996 | Cadien et al. .................. 51/308 |
| 5,551,986 | 9/1996 | Jain .................. 134/4 |

OTHER PUBLICATIONS

Miyashita et al., "A New Post CMP Cleaning Method For Trench Isolation Process", First International Chemical–Mechanical Polish (C.M.P.) for VLSI/ULSI Multilevel Interconnection Conference (CMP–MIC), pp. 159–168, 1996.

*Primary Examiner*—R. Bruce Breneman
*Assistant Examiner*—Michael E. Adjodha
*Attorney, Agent, or Firm*—Finnegan, Henderson, Farabow, Garrett & Dunner, L.L.P.

[57] ABSTRACT

This invention provides a CMP (Chemical-Mechanical Polishing) method for controlling the polishing rate using ionized water and a CMP apparatus which employs the CMP method. A polishing pad is attached to a polishing disc. A semiconductor wafer is held by a wafer carrier placed above the polishing disc, and is pressed by the wafer carrier against the polishing pad which rotates together with the polishing disc. As a result, the semiconductor wafer is polished. The polishing is performed while a polishing slurry containing polishing particles is supplied to the polishing pad from a polishing slurry tank through a polishing-slurry supply pipe, and ionized water is supplied thereto through an ionized-water supply pipe. In the case of using alkaline ionized water as the ionized water, the polishing rate can be increased in a stable manner by increasing the pH value of alkaline ionized water, and can be reduced in a stable manner by reducing the pH value of alkaline ionized water. On the other hand, in the case of using acidic ionized water as the ionized water, the polishing rate can be increased in a stable manner by reducing the pH value of acidic ionized water, and can be reduced in a stable manner by increasing the pH value of acidic ionized water.

26 Claims, 6 Drawing Sheets

CHEMICAL-MECHANICAL POLISHING (CMP) METHOD FOR CONTROLLING POLISHING RATE USING IONIZED WATER, AND CMP APPARATUS

BACKGROUND OF THE INVENTION

1. Field of the Invention

This invention relates to a method for chemically polishing a semiconductor substrate using a polishing turn table to thereby flatten the same, and also to an apparatus for executing the method.

2. Description of the Related Art

In general, semiconductor devices such as ICs, LSIs, etc. are formed in the following processes: A design process for designing an integrated circuit to be formed on a semiconductor substrate; a mask-forming process for patterning the substrate with an electron beam to form the integrated circuit; a wafer-forming process for forming a wafer of a predetermined thickness from a monocrystalline ingot; a water-treating process for forming a semiconductor element such as an integrated circuit on the wafer; and an assembling/inspecting process for dividing the wafer into semiconductor chips and packaging them into semiconductor devices. Each process requires an apparatus dedicated thereto. In addition to the apparatus dedicated to each process, apparatuses necessary for the overall equipments and the environment, such as a pre-treatment apparatus, an exhaust-gas treatment apparatus, etc., are used to manufacture semiconductor devices.

In the conventional wafer treatment process, a CMP (Chemical-Mechanical Polishing) method is used to flatten the surface of a semiconductor substrate, which is obtained after any voluntary films such as a metal film, a polysilicon film, a silicon oxide film ($SiO_2$) film, etc. are embedded in trenches or contact holes formed therein.

Figure 1:
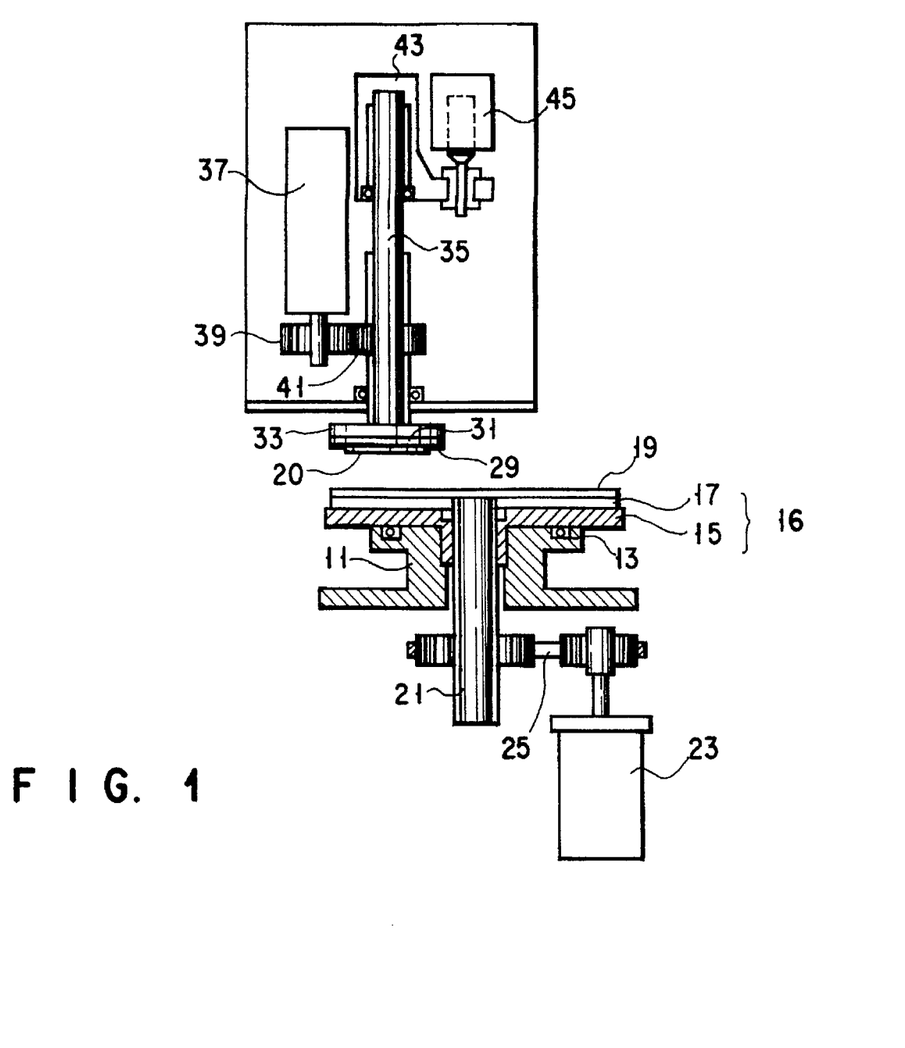
FIG. 1 is a schematic sectional view, showing a general CMP apparatus.

FIG. 1 is a schematic sectional view, showing a general CMP apparatus for flattening a wafer surface. As is shown in FIG. 1, a turn table 16, which includes a polishing disc 17 and a support unit 15, is placed on a stage 11 with a bearing 13 interposed therebetween. A polishing pad 19 is attached to the upper surface of the polishing disc 17 for polishing a wafer. A driving shaft 21 is provided for rotating the turn table 16. The driving shaft 21 is rotated by a motor 23 via a rotating belt 25. On the other hand, a semiconductor wafer 20 is supported by a wafer carrier 33. The wafer carrier 33 has a retainer ring 29 and an adsorption pad 31 for holding the wafer by a vacuum force or the tension of water. The wafer 20 has its position controlled by the wafer carrier 33 such that it is opposed to the polishing pad 19. The wafer carrier 33 is connected to a driving shaft 35. The driving shaft 35 is rotated by a motor 37 via gears 39 and 41, and fixed to a driving unit 43 for vertically move the shaft 35.

In the above-described structure, the driving unit 43 vertically moves in accordance with vertical movement of a cylinder 45, thereby moving the wafer 20 attached to the wafer carrier 33 to or from the polishing pad 19. At the time of polishing, an appropriate polishing slurry is supplied between the wafer 20 and the polishing pad 19. Further, the wafer 20 can be horizontally moved during polishing by means of another driving unit (not shown).

Figure 2A:
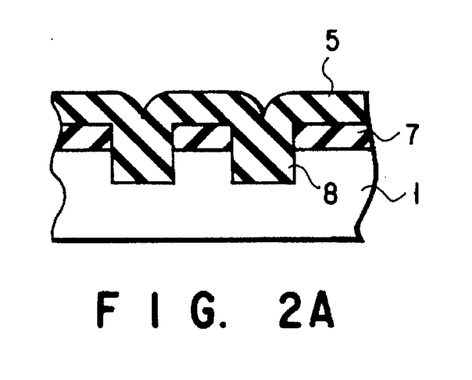
FIGS. 2A and 2B are sectional views, showing manufacturing processes for forming a semiconductor device as a first example by means of a general CMP apparatus.

Referring then to FIGS. 2A and 2B, an example of a flattening treatment of a wafer surface by the FIG. 1 CMP apparatus using the CMP method will be described. First, an $Si_3N_4$ film 7 is formed on a semiconductor substrate 1. Then, the film 7 and the substrate 1 is patterned by etching to form grooves 8. An $SiO_2$ film 5 is deposited on the film 7 and in the grooves 8 (see FIG. 2A).

Figure 2B:
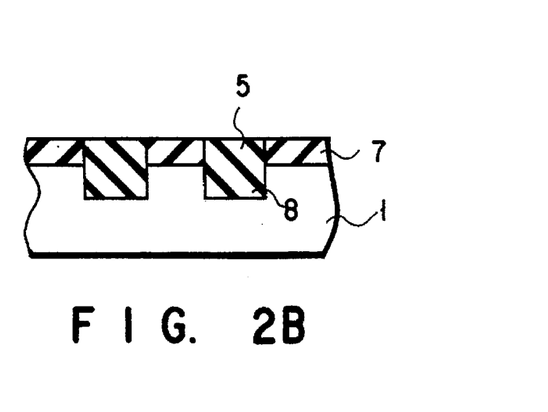

Thereafter, the $SiO_2$ film 5 is polished by the CMP method until the $Si_3N_4$ film 7 which will serve as a stopper film is exposed. As a result, the embedding of the $SiO_2$ film 5 into the grooves 8 is completed, and at the same time the surface of the semiconductor substrate 1 is uniformly flattened (see FIG. 2B).

It should be noted that the CMP method itself is not a new technique but a conventional one used in the aforementioned wafer-forming process.

This CMP technique has recently been used in a process for manufacturing a highly integrated semiconductor device.

Referring then to FIGS. 3A, 3B and 4A to 4C, applications of the CMP technique will be described.

Figure 3A:
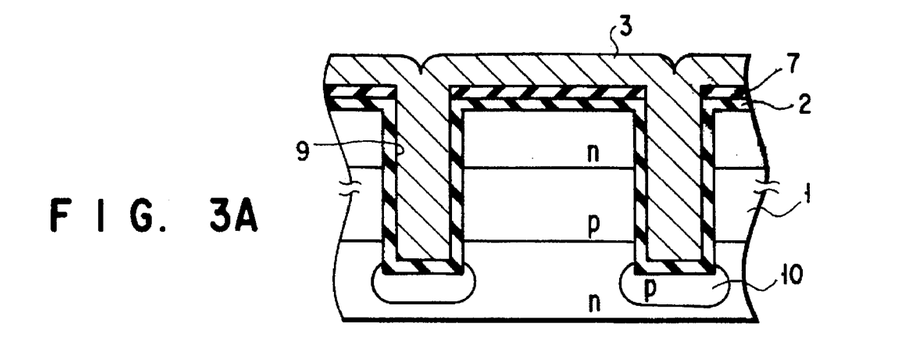
FIGS. 3A and 3B are sectional views, showing manufacturing processes for forming a semiconductor device as a second example by means of a general CMP apparatus.
Figure 3B:
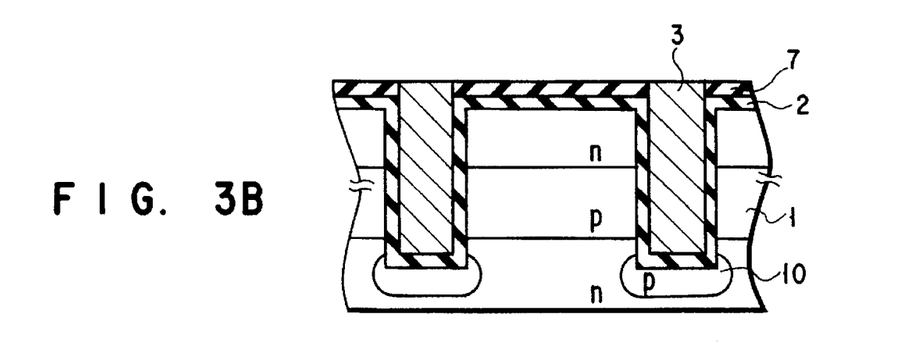

FIGS. 3A and 3B show an application of the CMP method used in a process for separating trench elements. After an $SiO_2$ film 2 is formed by thermal oxidation of the surface of the semiconductor substrate 1, an $Si_3N_4$ film 7 which will serve as a stopper film is formed by the CVD method. Subsequently, the films 2 and 7 are patterned by lithography to form grooves 9. Those surface portions of the semiconductor substrate 1 which constitute the inner surfaces of the grooves 9 are oxidized, and then boron is injected into the bottoms of the grooves 9 to form channel cut regions 10. Thereafter, a polysilicon film 3 is formed by the CVD method on the $Si_3N_4$ film 7 and in the grooves 9 (FIG. 3A). An $SiO_2$ film may be used in place of the polysilicon film. Then, the polysilicon film 3 on the semiconductor substrate 1 is polished until the $Si_3N_4$ film 7 is exposed (FIG. 3B). In this case, a polishing rate as low as about $1/10$–$1/200$ is employed, and hence the polishing can be stopped when the $Si_3N_4$ film 7 is exposed. Thus, the polysilicon film 3 is formed only in the grooves 9. As is evident from the above, the polishing can be stopped just when the stopper film is exposed, by using, as the stopper film, a film of a polishing rate lower than that of a film to be polished, and designating an appropriate polishing period of time.

Figure 4A:
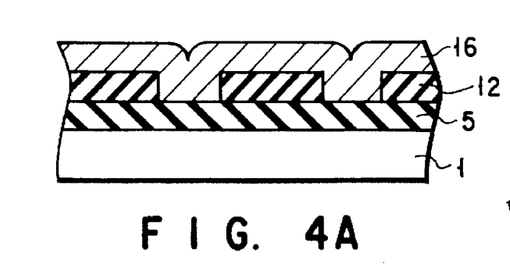
FIGS. 4A to 4C are sectional views, showing manufacturing processes for forming a semiconductor device as a third example by means of a general CMP apparatus.
Figure 4B:
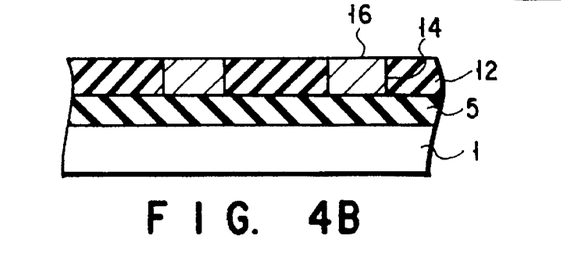
Figure 4C:
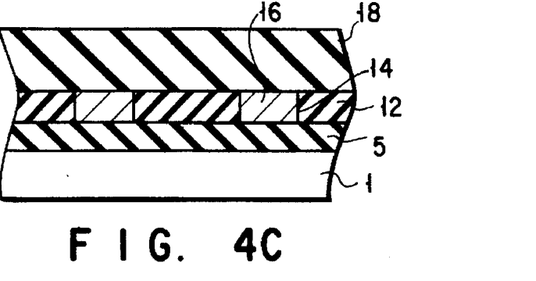

Referring to FIGS. 4A to 4C, an application of the CMP method used to embed a metal wire in a groove formed in an insulating film will be described.

A CVD-$SiO_2$ film 5 and a plasma $SiO_2$ film 12 are sequentially formed on the semiconductor substrate 1. Then, the plasma $SiO_2$ film 12 is patterned to form grooves 14 therein. A Cu film 16 is deposited in the grooves 14 and on the film 12 (FIG. 4A). The Cu film 16 is polished using the plasma film 12 as a stopper film. When the plasma film 12 has been exposed, the polishing of the Cu film 16 is finished, thereby finishing the embedding of the Cu film 16 in the grooves 14. Thus, an embedded Cu wire is formed (FIG. 4B). As a result of polishing, the surface of the semiconductor substrate 1 is flattened, which facilitates forming of a plasma $SiO_2$ film 18 as a second layer on the substrate (FIG. 4C). The flattening by the CMP method facilitates forming of electrode wires (not shown) as second and third wire layers.

At the time of polishing a polysilicon film or an oxide film formed on a semiconductor wafer using the conventional CMP apparatus, a colloidal silica polishing slurry, which is made by mixing silica particles as polishing particles with an alkaline solvent, is supplied to the working area of the polishing pad (which is brought into contact with the semiconductor wafer). The reason why the alkaline polishing slurry is used is that polysilicon reacts to hydroxide ions, which accelerates polishing. In light of this, NaOH, KOH, $NH_3$, etc. is added into a solvent. This will inevitably produce a great amount of metal impurities as compared with the other processes, and will cause contamination.

On the other hand, at the time of polishing a 10 metal film formed on a semiconductor wafer, a polishing slurry made by mixing polishing particles with an acidic solvent is supplied to the working area. The reason why the acidic polishing slurry is used is that the metal film reacts to hydrogen ions, which accelerates polishing. Since an additive for making the polishing particles acidic contains metal impurities such as iron, etc., a great amount of metal impurities will be produced as compared with the other processes, and hence contamination may well occur.

To avoid such contamination, it is necessary to perform chemical cleaning at least twice, i.e. after polishing and before the next treatment, which will inevitably make the manufacturing process complicated and increases the cost of the equipments.

SUMMARY OF THE INVENTION

It is the object of the invention to provide a semiconductor-manufacturing method for minimizing metal contamination and controlling the polishing rate, and also provide a semiconductor-manufacturing apparatus with low metal contamination.

To attain the above object, there is provided a CMP method of chemically mechanically polishing a semiconductor wafer, comprising:

a supply step of supplying a polishing pad for polishing the semiconductor wafer with ionized water created by electrolyzing deionized water, and with a polishing slurry containing polishing particles; and a polishing step of polishing that major surface of the semiconductor wafer which has a to-be-polished film formed thereon, using the polishing pad, the polishing step being executed while the supply step is executed.

Since in the above-described structure of the invention, ionized water which contains no metal impurities is used, the pH value of the polishing slurry can be kept constant, and accordingly metal contamination can be minimized during polishing. Further, the ionized water enables the polishing rate to be adjusted, and also enables the surface of a semiconductor wafer obtained after polishing to be electrically stabilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

It is not considered preferable these days to use a fluorine-based solvent such as freon, etc. in manufacturing semiconductor devices, since it adversely affects the environment. In place of the fluorine-based solvent, deionized water has recently been used as the safest solvent. Deionized water is of high purity with a resistance of about 5 to 18 M$\Omega$cm, which contains almost no impurities including ions, fine particles, microbes, organic matters, etc. A water purifying apparatus (deionizer) very efficiently removes materials suspended or dissolved in water, thereby creating extremely pure water. Deionized water may also be called "pure water" when its electric conductivity $\rho$ is lower than 10 $\mu$Scm, and "extrapure water" when it is lower than 0.055 $\mu$Scm.

In the present invention, deionized water is electrolyzed to create highly-oxidizable positive-ionized water which contains oxygen and ozone, and highly-reducible negative-ionized water. These positive-ionized water and negative-ionized water are used for chemical-mechanical polishing.

Figure 5:
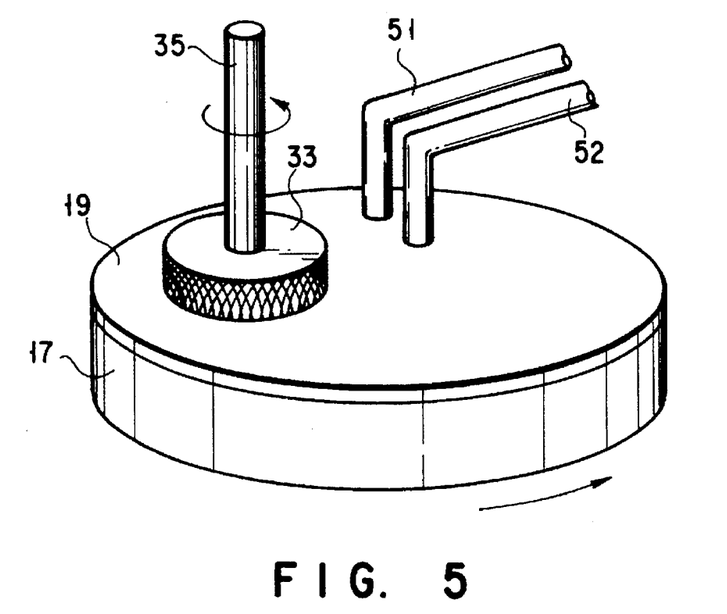
FIG. 5 is a perspective view, showing an essential part of a CMP apparatus according to a first embodiment of the invention.

FIG. 5 is an enlarged perspective view of an essential part of a CMP apparatus according to a first embodiment of the invention, showing a wafer carrier 33, a polishing disc 17 and its peripheral elements. This CMP apparatus has basically the same structure as the FIG. 1 apparatus. In the CMP apparatus of the invention, the polishing disk 17 has a support unit (not shown) provided at a lower portion thereof, and a driving shaft (not shown) is provided at a center portion of the polishing disk 17. The polishing disc 17 rotates together with the driving shaft when a motor (not shown) rotates. A polishing pad 19 formed of polyurethan foam or polyurethan nonwoven fabric is attached to the upper surface of the polishing disc 17. A semiconductor wafer (not shown) is held by the wafer carrier 33 by a vacuum force, etc. such that it is opposed to the polishing pad 19. A driving shaft 35 is provided on a center portion of the wafer carrier 33 for rotating the carrier 33 in accordance with the rotation of a motor (not shown). Further, the semiconductor wafer held by the wafer carrier 33 is pressed against the polishing pad 19 and released therefrom in accordance with the movement of the driving shaft 35.

In the invention, at the time of polishing a semiconductor wafer, a polishing slurry which contains polishing ceria ($CeO_2$) or silica ($SiO_2$) particles is supplied from a polishing tank through a polishing-slurry supply pipe 51 to the polishing pad 19, and at the same time ionized water is supplied from an ionized-water supply pipe 52 to the polishing pad 19. To this end, the polishing-slurry supply pipe 51 and the ionized-water supply pipe 52 have their nozzles located above the polishing pad 19 and in the vicinity of the wafer carrier 33 which holds the semiconductor wafer. The polishing slurry and ionized water are supplied to the working area of the polishing pad 19 and mixed with each other by means of the supply pipes 51 and 52. The supply pipes 51 and 52 are movable over the polishing pad 19.

At the time of polishing, the semiconductor wafer is pressed against the polishing pad 19 on the polishing disc 17 with a pressing force of 50 to 500 g/cm while the pad 19 and the disc 17 rotate at 20 to 200 rpm.

Ionized water supplied from the ionized-water supply pipe 52 can be classified into alkaline ionized water and acidic ionized water. Ionized water of a desired pH is created by electrolyzing, at a low voltage, deionized water which contains no electrolyte, i.e. no metal impurity, in an electrolytic bath with a solid electrolyte contained therein. Where alkaline ionized water is used and the polishing rate is changed during polishing, the rate can be increased in a stable manner by increasing the pH value of alkaline ionized water, and can be reduced in a stable manner by reducing the pH value of alkaline ionized water. On the other hand, in the case of using acidic ionized water, the polishing rate can be increased in a stable manner by reducing the pH value of acidic ionized water, and can be reduced in a stable manner by increasing the pH value of acidic ionized water.

Figure 6:
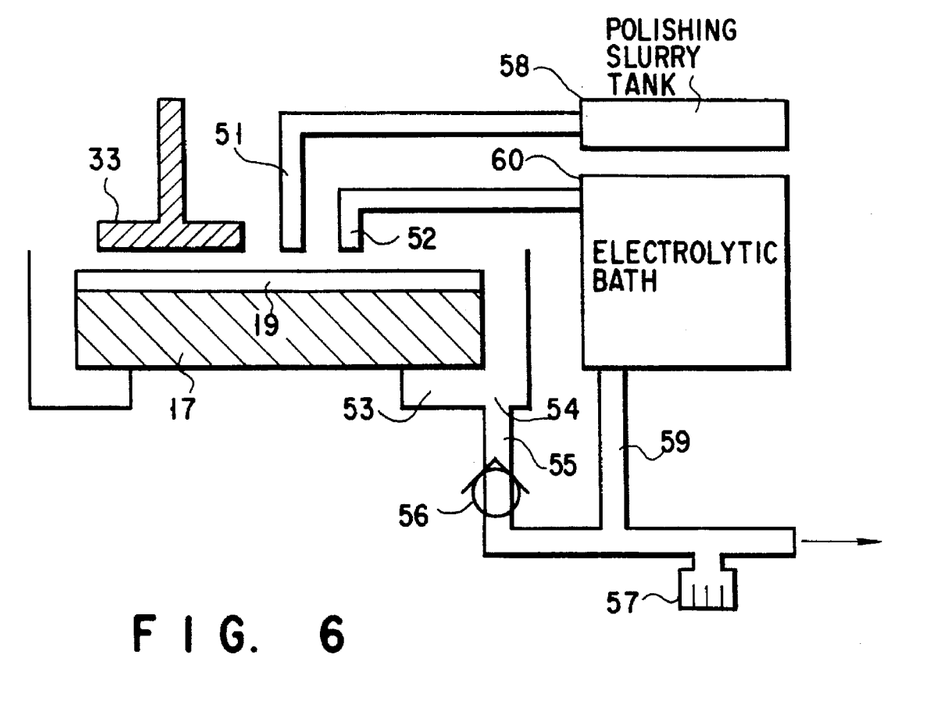
FIG. 6 is a schematic sectional view, showing an essential part of a CMP apparatus according to a second embodiment of the invention.

FIG. 6 is a sectional view, showing a CMP apparatus according to a second embodiment of the invention, and specifically showing a wafer carrier, a polishing disc, a waste water mechanism and an electrolytic bath for supplying ionized water. This CMP apparatus has the same basic structure as that shown in FIG. 1. A polishing pad 19 formed of polyurethan nonwoven fabric, etc. for polishing a semiconductor wafer is attached to the upper surface of a polishing disc 17. A semiconductor wafer (not shown) is held by a wafer carrier 33 by a vacuum force, etc. such that it is opposed to the polishing pad 19. A driving shaft 35 is provided on a center portion of the wafer carrier 33 for rotating the carrier 33 in accordance with the rotation of a motor (not shown). Further, the semiconductor wafer held by the wafer carrier 33 is pressed against the polishing pad 19 and released therefrom in accordance with the movement of the driving shaft 35.

At the time of polishing the semiconductor wafer, a polishing slurry containing polishing particles such as silica particles is supplied from a polishing tank 58 through a polishing-slurry supply pipe 51 to the polishing pad 19, and at the same time ionized water is supplied from an ionized-water supply pipe 52 to the polishing pad 19. To this end, the polishing-slurry supply pipe 51 and the ionized-water supply pipe 52 have their nozzles located above the polishing pad 19 and in the vicinity of the wafer carrier 33 which holds the semiconductor wafer. The supply pipes 51 and 52 are disposed to be movable over the polishing pad 19, thereby supplying the polishing slurry and ionized water to the working area of the polishing pad 19 and permitting them to be mixed with each other.

The rotary polishing disc 17 is received in an envelope 53 so as to prevent the wasted polishing slurry and ionized water having been used for polishing from scattering to the outside. An exhaust port 54 is formed in the bottom of the envelope 53 for exhausting the wasted water. A wasted water pipe 55 is connected to the exhaust port 54. A one-way valve 56 is voluntarily provided across the waste pipe 55 for preventing reverse flow of the wasted water. Further, a sediment bath 57 is voluntarily provided for separating polishing particles having been used for polishing from the wasted water.

The polishing-slurry supply pipe 51 is connected to the polishing slurry tank 58, while the ionized-water supply pipe 52 is connected to an electrolytic bath 60. An ionized-water exhaust pipe 59 is connected to the wasted water pipe 55 lead from the envelope 53. A one-way valve may be provided across the ionized-water exhaust pipe 59, too.

The above-described pipe structure enables the ionized water exhausted from the electrolytic bath 60 to be mixed with the ionized water contained in the wasted water, thereby neutralizing them. Thus, the wasted pipe 55 and the ionized-water exhaust pipe 59 connected thereto constitute a neutralization mechanism. In general, when in the electrolytic bath, alkaline (or acidic) ionized water is created, acidic (or alkaline) ionized water of the same amount is also created. Therefore, in the case of performing polishing using alkaline ionized water, acidic ionized water created simultaneously and not necessary for polishing is collected through the ionized-water exhaust pipe 59 to the wasted-water pipe 55 to neutralize the wasted water created during polishing.

Figure 7:
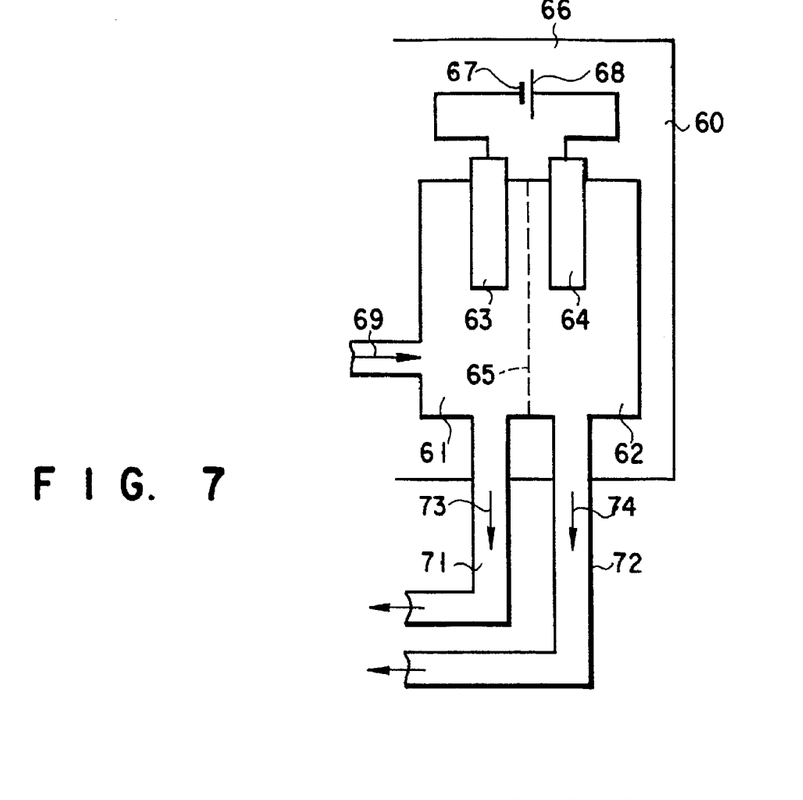
FIG. 7 is a schematic sectional view, showing an essential part of a CMP apparatus according to a third embodiment of the invention.

FIG. 7 is a sectional view of a CMP apparatus according to a third embodiment of the invention, showing an electrolytic bath. As is shown in FIG. 7, an electrolytic bath 60 has a cathode chamber 61 and an anode chamber 62. The cathode chamber 61 contains a cathode 63, while the anode chamber 62 contains an anode 64. These electrodes 63 and 64 are formed of platina or titanium. The cathode and anode chambers 61 and 62 are partitioned by a porous barrier membrane 65 for efficiently separating negative-ionized water 73 created in the cathode chamber 61, from positive-ionized water 74 created in the anode chamber 62. The cathode 63 in the electrolytic bath 60 is connected to the negative electrode 67 of a battery 66, and the anode 64 to the positive electrode 68 of the battery 66.

In the electrolytic bath 60, a diluent electrolyte solution 69 with a supporting electrolyte (e.g. ammonium chloride) contained therein is mixed with deionized water, and a power voltage is applied thereto from the battery 66, thereby electrolyzing the deionized water. Negative-ionized water 73 created on the side of the cathode 63 as a result of electrolyzation is alkaline ionized water, while positive-ionized water 74 created on the side of the anode 64 is acidic ionized water. Moreover, if deionized water is electrolyzed in the bath 60 using oxalic acid as the supporting electrolyte, both negative-ionized water created on the side of the cathode and positive-ionized water created on the side of the anode exhibit acidic properties. The negative-ionized water 73 in the cathode chamber 61 is supplied to the outside through a negative-ionized water supply pipe 71, and the positive-ionized water in the anode chamber 62 is supplied to the outside through a positive-ionized water supply pipe 72.

Since alkaline ionized water is usually created in the cathode chamber 61, the negative-ionized water supply pipe 71 connected to the electrolytic bath 60 is used, in the third embodiment, as the ionized-water supply pipe 52 for supplying alkaline ionized water to the polishing pad 19, when polishing is performed using alkaline ionized water. In this case, acidic ionized water created in the anode chamber 62 is not necessary and hence exhausted. Accordingly, the positive-ionized water supply pipe 72 is used as the ionized water exhaust pipe 59 for exhausting ionized water, and connected to the wasted water pipe 55. On the other hand, if polishing is performed using acidic ionized water, the positive-ionized water supply pipe 72 connected to the electrolytic bath 60 is used as the ionized-water supply pipe 52 for supplying acidic ionized water to the polishing pad 19. In this case, alkaline ionized water created in the cathode chamber 61 is not necessary and hence exhausted. Thus, the negative-ionized water supply pipe 71 is used as the ionized water exhaust pipe 59 for exhausting ionized water, and connected to the wasted water pipe 55. (See FIG. 6)

Ionized water can be classified into alkaline ionized water and acidic ionized water. Ionized water of a desired pH is created by electrolyzing, at a low voltage, deionized water which contains no electrolyte, i.e. no metal impurity, in an electrolytic bath with a solid electrolyte contained therein. Where in the case of using alkaline ionized water, the polishing rate is changed during polishing, it can be increased in a stable manner by increasing the pH value of alkaline ionized water, and can be reduced in a stable manner by reducing the pH value of alkaline ionized water. On the other hand, in the case of using acidic ionized water, the polishing rate can be increased in a stable manner by reducing the pH value of acidic ionized water, and can be reduced in a stable manner by increasing the pH value of acidic ionized water.

Whether alkaline ionized water or acidic ionized water is used depends upon the kind of a film deposited on a semiconductor wafer.

Ionized water can electrically stabilize the surface of the film deposited on the wafer obtained after polishing. Acidic ionized water is suitable for a deposit film made of a metal with a high melting point, such as Al, Cu, W, etc. Such a deposit film has its surface oxidized by acidic ionized water after polishing, with the result that the potential of the surface is stabilized.

Alkaline ionized water or acidic water is suitable for a deposit film made of silicon oxide ($SiO_2$), silicon nitride ($Si_3N_4$), polysilicon or monocrystalline silicon. Alkaline ionized water can electrically stabilize the surface of such a deposit film. Alkaline ionized water should be used in the FIG. 2B case where a $SiO_2$ film is polished, and in the FIG. 3B case where a polysilicon film is polished. On the other hand, acidic ionized water should be used in the FIG. 4B case where a Cu film is polished.

Figure 8:
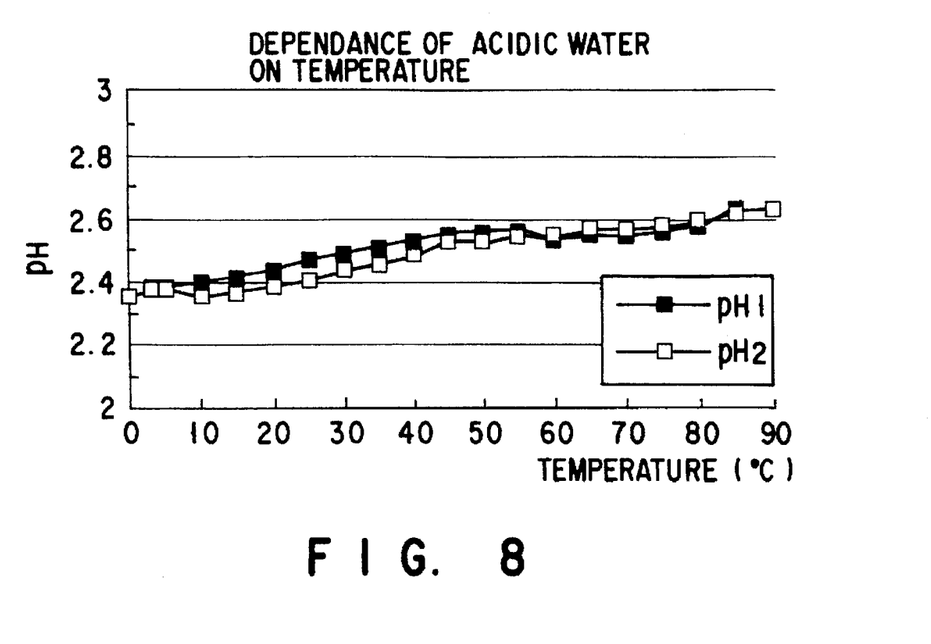
FIG. 8 is a graph, showing the dependence of the pH value of acidic ionized water on the temperature.
Figure 9:
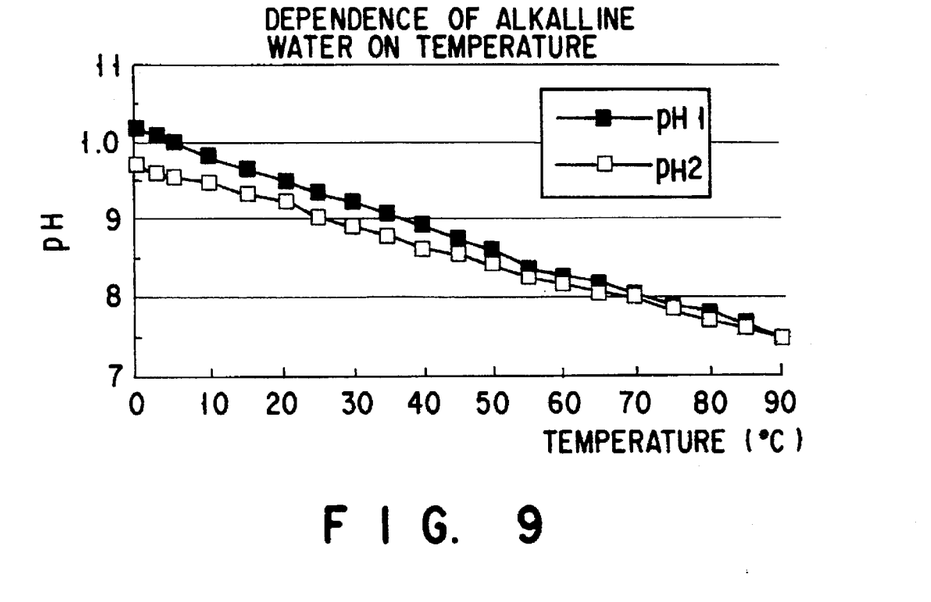
FIG. 9 is a graph, showing the dependence of the pH value of alkaline ionized water on the temperature.

Conditions such as the polishing rate, the degree of stabilization of a deposit film, etc. depend upon the pH value of ionized water. Therefore, adjustment of the pH value of ionized water is very important to set optimal polishing conditions. Since the pH value of ionized water depends upon its temperature as 10 evident from FIGS. 8 and 9, it can be accurately adjusted by controlling the temperature of ionized water. FIGS. 8 and 9 show the dependence of the pH value of ionized water upon its temperature. Specifically, FIG. 8 shows the dependence of the pH value of acidic ionized water upon its temperature, and FIG. 9 the dependence of the pH value of alkaline ionized water upon its temperature. Each of FIGS. 8 and 9 shows data on two kinds of ionized water (i.e. ionized water of pH 1 and that of pH2). As can be understood from these figures, the pH value of acidic ionized water increases as its temperature increases, whereas that of alkaline ionized water reduces as its temperature increases. Further, the rate of change in pH is higher in alkaline ionized water than in acidic ionized water.

Figure 10:
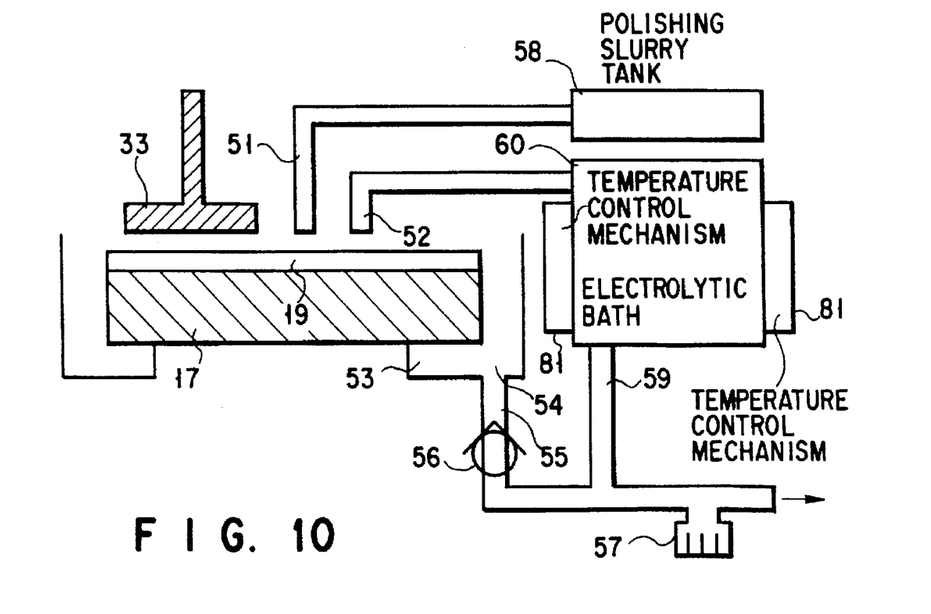
FIG. 10 is a schematic sectional view, showing an essential part of a CMP apparatus according to a fourth embodiment of the invention.

FIG. 10 is a sectional view, showing an essential part of a CMP apparatus according to a fourth embodiment of the invention. The fourth embodiment aims to realize more stable control of polishing. To this aim, a temperature control mechanism 81 for controlling the pH value of ionized water to a predetermined value is provided in addition to the structure of FIG. 6.

The basic conditions for polishing employed in the CMP apparatus of this embodiment are the same as those in the first embodiment. From experiments, it was found that the optimal pH value of ionized water is 2 to 4 in the case of acidic ionized water, and 9.5 to 10.5 in the case of alkaline ionized water. These optimal pH values could be kept by setting the temperature of the ionized water to a room temperature (25° C.) by means of the temperature control mechanism 81.

FIGS. 11 to 14 are sectional views, showing modifications of the supply pipes incorporated in the CMP apparatus of the invention. Each of these figures shows end portions of the polishing-slurry supply pipe and the ionized-water supply pipe.

Figure 11:
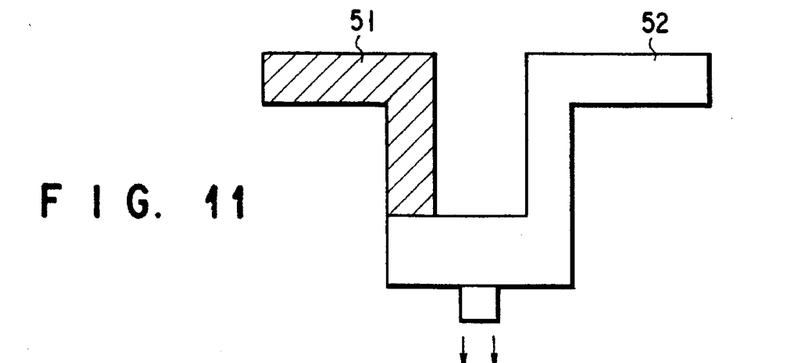
FIG. 11 is a schematic sectional view, showing first examples of supply pipes employed in the CMP apparatus of the invention.
Figure 12:
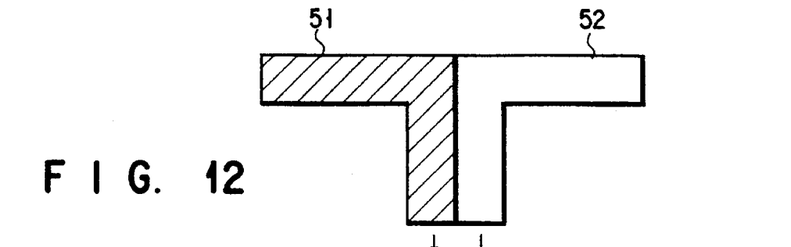
FIG. 12 is a schematic sectional view, showing second examples of supply pipes employed in the CMP apparatus of the invention.
Figure 13:
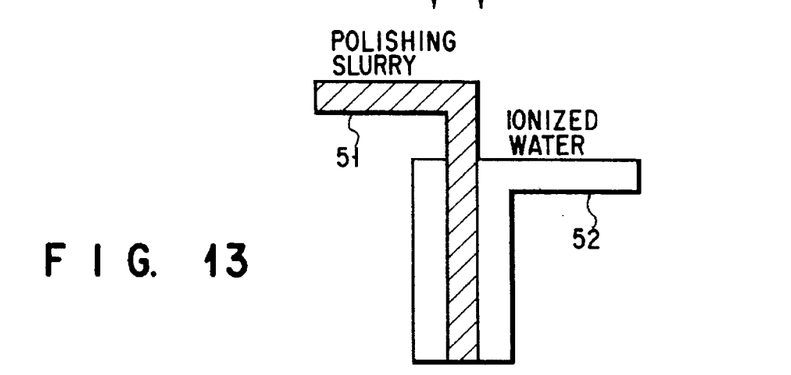
FIG. 13 is a schematic sectional view, showing third examples of supply pipes employed in the CMP apparatus of the invention.
Figure 14:
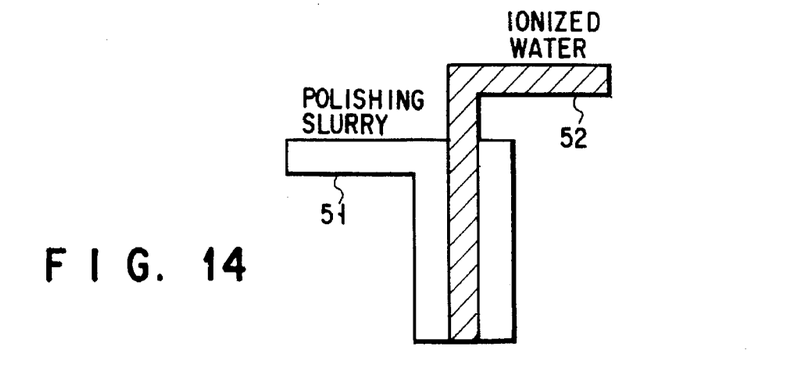
FIG. 14 is a schematic sectional view, showing fourth examples of supply pipes employed in the CMP apparatus of the invention.

In the FIG. 11 case, the polishing-slurry supply pipe 51 and the ionized-water supply pipe 52 are integrated with each other and have a common end portion. This structure enables the polishing slurry and ionized water to be easily supplied to the working area of the polishing pad. As a result, polishing and surface stabilization successive to the polishing can be accurately and effectively performed. In the FIG. 12 case, the pipes 51 and 52 are not integrated with each other but arranged close to each other. Therefore, this structure can provide almost the same advantage as the FIG. 11 structure. In the FIG. 13 case, the polishing-slurry supply pipe 51 has an end portion thereof received in an end portion of the ionized-water supply pipe 52. In the FIG. 14 case, the ionized-water supply pipe 52 has an end portion thereof received in an end portion of the polishing-slurry supply pipe 51. Since in these cases, too, the supply pipes have their end portions integrated with each other, the same advantage as the FIG. 11 case can be obtained. The polishing-slurry supply pipe 51 and the ionized-water supply pipe 52 are made of a teflon-based or ceramic-based material. Alternatively, the polishing-slurry supply pipe 51 may be made of a ceramic-based material, and the ionized-water supply pipe 52 of a teflon-based material.

When the above-described structure and method are applied to a polishing process using the CMP apparatus, the following advantages can be obtained:

First, since the polishing slurry contains no metals, metal contamination will not occur, and accordingly cleaning for removing metal impurities is not necessary. As a result, the number or required processes can be reduced, thereby enhancing the throughput. Second, the polishing rate can be controlled. For example, where alkaline ionized water is used for polishing, polishing is accelerated as a result of reaction between alkaline ionized water and hydroxide ions. In light of this, the polishing rate can be easily adjusted by varying the injection amount of alkaline ionized water. Further, in the case of using acidic ionized water for polishing, polishing is accelerated as a result of reaction between acidic ionized water and hydrogen ions. In light of this, the polishing rate can be easily adjusted by varying the injection amount of acidic ionized water. Moreover, ionized water electrically stabilizes the surface of a semiconductor wafer obtained after polishing.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A CMP method of chemically mechanically polishing a semiconductor wafer, comprising:
   a polishing step of polishing a to-be-polished film formed on the semiconductor wafer using a polishing pad, while supplying a working area of the polishing pad with a polishing slurry containing polishing particles; and
   a supply step of supplying ionized water created by electrolyzing deionized water, to a major surface of the semiconductor wafer obtained after polishing.

2. The CMP method according to claim 1, wherein the ionized water is one of alkaline ionized water and acidic ionized water.

3. The CMP method according to claim 1, further comprising the treatment step of neutralizing a wasted water created in the polishing step.

4. The CMP method according to claim 3, wherein the ionized water is alkaline ionized water, and in the treatment step, the wasted water created in the polishing step is neutralized by acidic ionized water.

5. The CMP method according to claim 3, wherein the ionized water is acidic ionized water, and in the treatment step, the wasted water created in the polishing step is neutralized by alkaline ionized water.

6. The CMP method according to claim 3, wherein in the supply step, the ionized water is acidic ionized water when the to-be-polished film formed on the semiconductor wafer is made of a metal.

7. The CMP method according to claim 3, wherein in the supply step, the ionized water is one of alkaline ionized water and acidic ionized water when the to-be-polished film formed on the semiconductor wafer is made of one of an oxide, a nitride, polycrystalline silicon and monocrystalline silicon.

8. A CMP method of chemically mechanically polishing a semiconductor wafer, comprising:
   a supply step of supplying a polishing pad for polishing the semiconductor wafer with ionized water created by electrolyzing deionized water, and with a polishing slurry containing polishing particles; and
   a polishing step of polishing that major surface of the semiconductor wafer which has a to-be-polished film formed thereon, using the polishing pad, the polishing step being executed while the supply step is executed.

9. The CMP method according to claim 8, wherein in the supply step, the ionized water and the polishing slurry are supplied to the polishing pad through different supply means.

10. The CMP method according to claim 8, wherein the ionized water and the polishing slurry will reach those portions of the polishing pad, which are located close to each other and the distance between which is smaller than the diameter of the semiconductor wafer.

11. The CMP method according to claim 8, wherein in the supply step, the ionized water and the polishing slurry is mixed with each other before they reach the polishing pad.

12. The CMP method according to claim 8, wherein the ionized water is one of alkaline ionized water and acidic ionized water.

13. The CMP method according to claim 8, further comprising the treatment step of neutralizing a wasted water created in the polishing step.

14. The CMP method according to claim 6, wherein the ionized water is alkaline ionized water, and in the treatment step, the wasted water created in the polishing step is neutralized by acidic ionized water.

15. The CMP method according to claim 6, wherein the ionized water is acidic ionized water, and in the treatment step, the wasted water created in the polishing step is neutralized by alkaline ionized water.

16. The CMP method according to claim 8 or 13, wherein the ionized water has its temperature controlled.

17. A chemical-mechanical polishing (CMP) apparatus comprising:
   a polishing pad for polishing a semiconductor wafer;
   a polishing disc having the polishing pad mounted thereon, and to be rotated by a driving shaft;
   a wafer carrier for holding the semiconductor wafer and pressing against the polishing pad that major surface of the semiconductor wafer which has a film to be polished;
   an ionized-water supply pipe for supplying the polishing pad with ionized water created by electrolyzing deionized water; and
   a polishing-slurry supply pipe for supplying the polishing pad with a polishing slurry containing polishing particles.

18. The CMP apparatus according to claim 17, wherein the ionized-water supply pipe and the polishing-slurry supply pipe are movable so that they can be opposed to voluntary portions of the polishing pad.

19. The CMP apparatus according to claim 17, wherein the ionized-water supply pipe and the polishing-slurry supply pipe have their supply ports formed integral with each other.

20. The CMP apparatus according to claim 17, further comprising:
   an envelope receiving the polishing disc;
   a wasted-water pipe connected to the bottom of the envelope; and
   a one-way valve for preventing a wasted water from reversely flowing from the wasted-water pipe to the envelope.

21. The CMP apparatus according to claim 17, further comprising:
   an envelope receiving the polishing disc;
   a wasted-water pipe connected to the bottom of the envelope; and
   a sediment bath connected to the wasted-water pipe.

22. The CMP apparatus according to claim 17, further comprising:

an electrolytic bath for electrolyzing the deionized water, the electrolytic bath being connected to the ionized-water supply pipe; and an ionized-water exhaust pipe connected to the electrolytic bath.

23. The CMP apparatus according to claim 17, further comprising:

an electrolytic bath for electrolyzing the deionized water, the electrolytic bath being connected to the ionized-water supply pipe;

an ionized-water exhaust pipe connected to the electrolytic bath;

an envelope receiving the polishing disc;

a wasted-water pipe connected to the bottom of the envelope and also to the ionized-water exhaust pipe;

a one-way valve for preventing a wasted water from reversely flowing from the wasted-water pipe to the envelope; and a sediment bath connected to the wasted-water pipe.

24. The CMP apparatus according to claim 17, wherein the ionized-water supply pipe and the polishing-slurry supply pipe are formed of a teflon-based material.

25. The CMP apparatus according to claim 17, wherein the ionized water is one of alkaline ionized water and acidic ionized water.

26. The CMP apparatus according to claim 17, further comprising a mechanism for controlling the temperature of the ionized water.

* * * * *